(12) United States Patent
Otsuki et al.

(10) Patent No.: US 7,623,348 B2
(45) Date of Patent: Nov. 24, 2009

(54) HEAT SINK AND COOLING APPARATUS

(75) Inventors: Takaya Otsuki, Kyoto (JP); Takamasa Yamashita, Kyoto (JP); Yoshinori Inoue, Kyoto (JP)

(73) Assignee: Nidec Corporation, Kyoto (JP)

( * ) Notice: Subject to any disclaimer, the term of this patent is extended or adjusted under 35 U.S.C. 154(b) by 116 days.

(21) Appl. No.: 11/863,308

(22) Filed: Sep. 28, 2007

(65) Prior Publication Data
US 2008/0080137 A1    Apr. 3, 2008

(30) Foreign Application Priority Data
Oct. 2, 2006    (JP)    ............... 2006-271241

(51) Int. Cl.
H05K 7/20    (2006.01)
F28F 7/00    (2006.01)
H01L 23/34    (2006.01)

(52) U.S. Cl. ............ 361/697; 165/80.2; 165/80.3; 165/185; 165/121; 257/722; 361/700; 361/703; 361/704

(58) Field of Classification Search ............... D13/179; 257/722; 361/697, 703
See application file for complete search history.

(56) References Cited

U.S. PATENT DOCUMENTS

| | | | |
|---|---|---|---|
| 5,794,685 A | | 8/1998 | Dean |
| 6,419,007 B1 * | | 7/2002 | Ogawara et al. ........... 165/80.3 |
| 6,671,172 B2 | | 12/2003 | Carter et al. |
| 6,714,415 B1 * | | 3/2004 | Shah ........................ 361/704 |
| D500,745 S | | 1/2005 | Duan et al. |
| 7,269,013 B2 * | | 9/2007 | Chen et al. ................ 361/700 |
| 7,362,573 B2 * | | 4/2008 | Lu et al. .................... 361/695 |
| 2002/0017378 A1 | | 2/2002 | Hu |
| 2002/0046826 A1 | | 4/2002 | Kao |
| 2003/0019609 A1 * | | 1/2003 | Hegde ...................... 165/80.3 |
| 2004/0190245 A1 * | | 9/2004 | Tirumala et al. ........... 361/690 |
| 2004/0240182 A1 * | | 12/2004 | Shah ........................ 361/704 |
| 2005/0056399 A1 * | | 3/2005 | Ku et al. ................... 165/80.3 |
| 2006/0213642 A1 * | | 9/2006 | Lai ........................... 165/80.3 |
| 2007/0159798 A1 * | | 7/2007 | Chen et al. ................. 361/700 |
| 2007/0253160 A1 * | | 11/2007 | Lu et al. .................... 361/695 |
| 2008/0121377 A1 * | | 5/2008 | Lin et al. ................. 165/104.33 |
| 2008/0142194 A1 * | | 6/2008 | Zhou et al. ................ 165/80.3 |

FOREIGN PATENT DOCUMENTS

CN    1503356 A    6/2004
JP    2004336031    11/2004

OTHER PUBLICATIONS

Chinese Office Action Dated May 8, 2009 With English Translation.

* cited by examiner

Primary Examiner—Gregory D Thompson
(74) Attorney, Agent, or Firm—Volentine & Whitt, PLLC

(57) ABSTRACT

A heat sink for dissipating a heat from an object includes a plurality of fins. The fins are arranged radially about a center axis to be spaced away from one another, and extend outward in a radial direction substantially perpendicular to the center axis. Each fin is branched at at least two different positions in the radial direction into at least three fin end portions spaced away from one another.

17 Claims, 9 Drawing Sheets

HEAT SINK AND COOLING APPARATUS

BACKGROUND OF THE INVENTION

1. Field of the Invention

The present invention relates to a cooling apparatus for cooling an electronic component including a CPU or MPU.

2. Description of the Related Art

CPUs (central processing units) or MPUs (micro processing Units) are key parts of computers for processing data to obtain results and outputting the results. The CPUs or MPUs are installed in high performance electronic devices. In recent years, clock frequency of CPUs or MPUs has been rapidly increased. This results in a continuous increase in heat generation thereof and therefore increases the temperature of the CPUs or MPUs. The temperature increase in CPUs or MPUs, however, may cause malfunction of the CPUs or MPUs. In order to prevent malfunction, it is crucial to cool the CPUs or MPUs. For this reason, an electronic component which generates heat, e.g., a CPU or an MPU, is used together with a cooling device for cooling it, when being arranged in a high performance electronic device.

A heat sink fan including a heat sink and a cooling fan mounted thereon is a typical cooling device used for the high performance electronic device. The heat sink is typically made of metal and has a plurality of heat-dissipating fins for increasing a total surface area of the heat sink. The cooling fan mounted on the heat sink supplies the heat sink with air. The heat sink fan is arranged in the high performance electronic device such that the heat sink is in contact with the heat generating component and the heat sink is forcibly cooled by the air from the cooling fan.

In recent years, operation speed of CPUs or MPUs has been increasing. Due to this, it is necessary to improve cooling efficiency of the heat sink fans used together with the CPUs or MPUs, and therefore improve heat transfer efficiency from the CPUs or MPUs to the heat sinks.

As stated above, the cooling efficiency of the heat sink is increased as the surface area thereof is increased. Therefore, the surface area of the entire heat sink has to be increased to improve the cooling efficiency of the heat sink. To increase the surface area of the heat sink, it may be one solution to form the heat-dissipating fins extremely small in circumferential thickness, arrange as many heat-dissipating fins as possible, and form each heat-dissipating fin so as to extend radially outward from a base portion of the heat sink. The thinned fins, however, deteriorate the heat sink in strength, and therefore, there exists a lower limitation in the thickness. Further, the configuration, where many heat-dissipating fins are arranged and each and every one of the heat-dissipating fins extends radially outward from the base portion, narrows each space between adjacent ones of the heat-dissipating fins because the adjacent ones come close. As a result, air blown to the heat sink is prevented from smoothly passing through the spaces between the adjacent heat-dissipating fins. Thus, simply increasing the surface area of the heat sink does not necessarily improve the cooling efficiency.

In a general configuration, the cooling fan is mounted on the heat sink, the cooling fan operates to send air to the heat sink, and thereby, heat transferred to the heat sink is dissipated. An improvement in the cooling efficiency of the heat sink can lower a rotational speed of the cooling fan mounted on the heat sink, and thereby, reduce a noise. In recent years, electronic devices having a CPU or MPU installed therein have become mainly used in quiet spaces, such as private homes and office rooms, and therefore, are required to be quieter. Thus, a heat sink higher in cooling characteristics and lower in noise is required.

SUMMARY OF THE INVENTION

According to preferred embodiments of the present invention, a heat sink for dissipating a heat from an object includes a plurality of fins arranged radially about a center axis to be spaced away from one another. The fins extend outward in a radial direction substantially perpendicular to the center axis. Each of the fins is split at least two different positions in the radial direction into at least three fin end portions spaced away from one another.

The heat sink may further include a generally columnar base portion centered on the center axis. The fins extend from the base portion outward in the radial direction. It is preferable that the fin end portions be curved in the same direction.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Hereinafter, a preferred embodiment of the present invention will be described with reference to FIGS. 1 to 8. Although, in the description of the preferred embodiments of the present invention, the terms "upper" and "lower" are used in accordance with each figure to show the upper and lower sides of the heat sinks and the heat sink fans for convenience, this does not restrict an actual mounting direction thereof.

Figure 1:
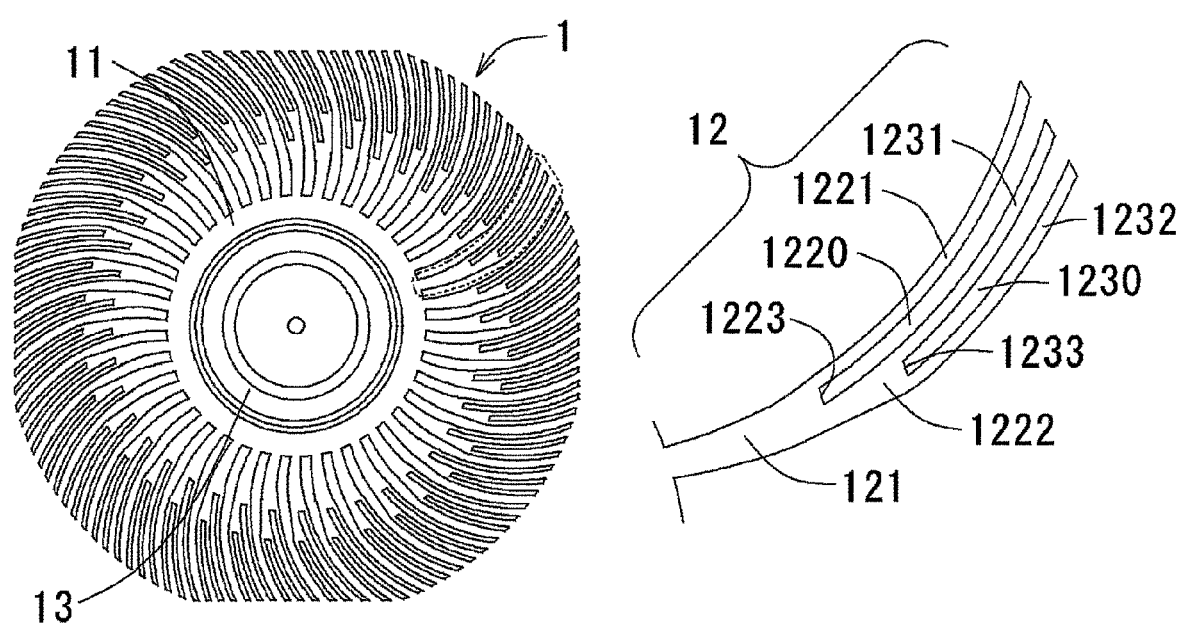
FIG. 1 is a plan view of a heat sink according to a preferred embodiment of the present invention.
Figure 2:
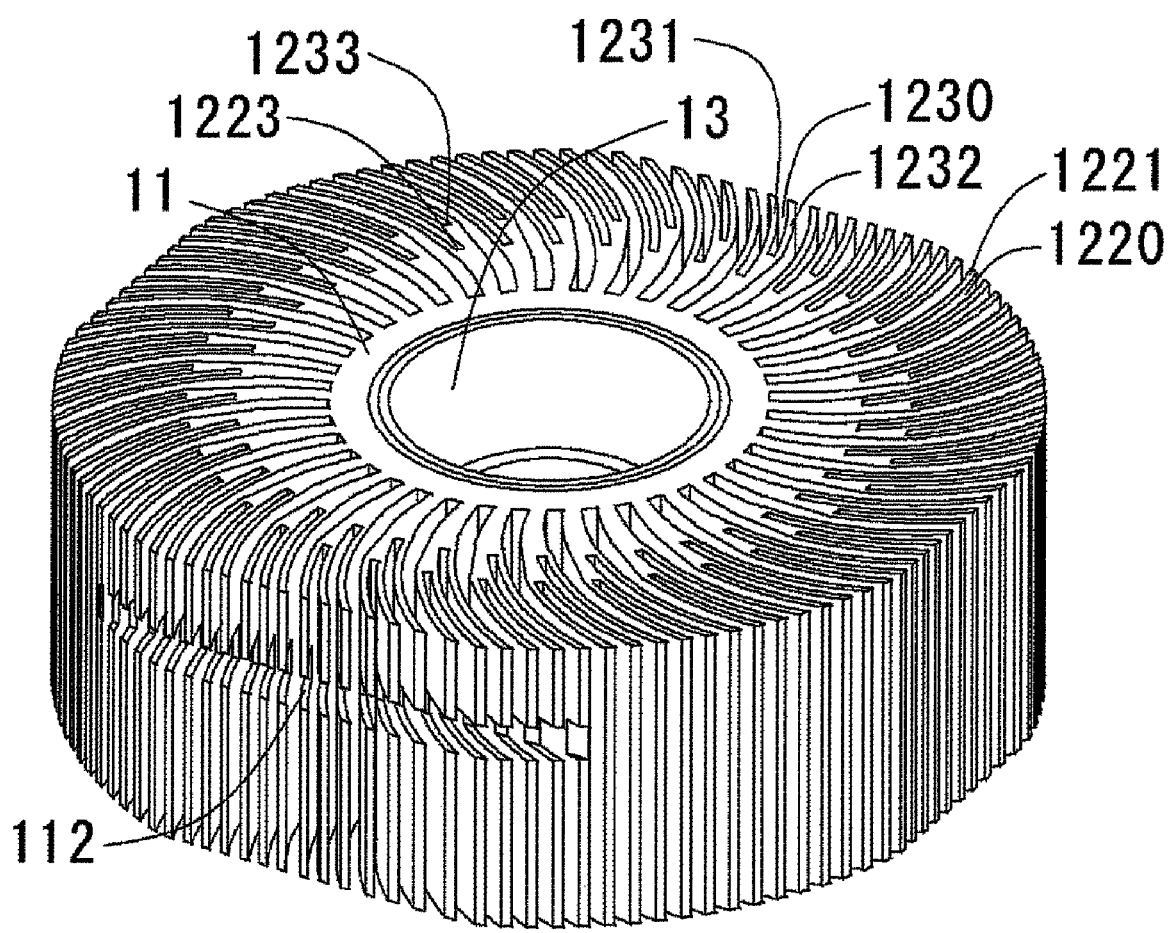
FIG. 2 is a perspective view of the heat sink according to the preferred embodiment of the present invention.
Figure 3:
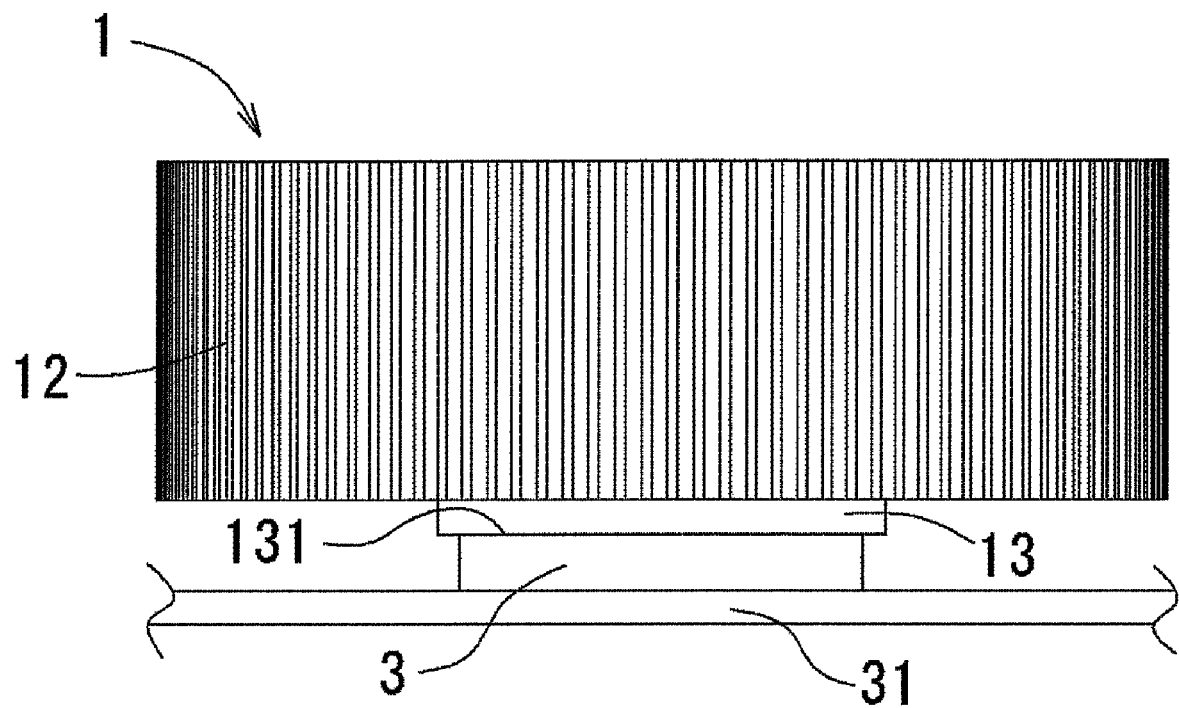
FIG. 3 is a plan view of the heat sink according to the preferred embodiment of the present invention which is in contact with an object.
Figure 4:
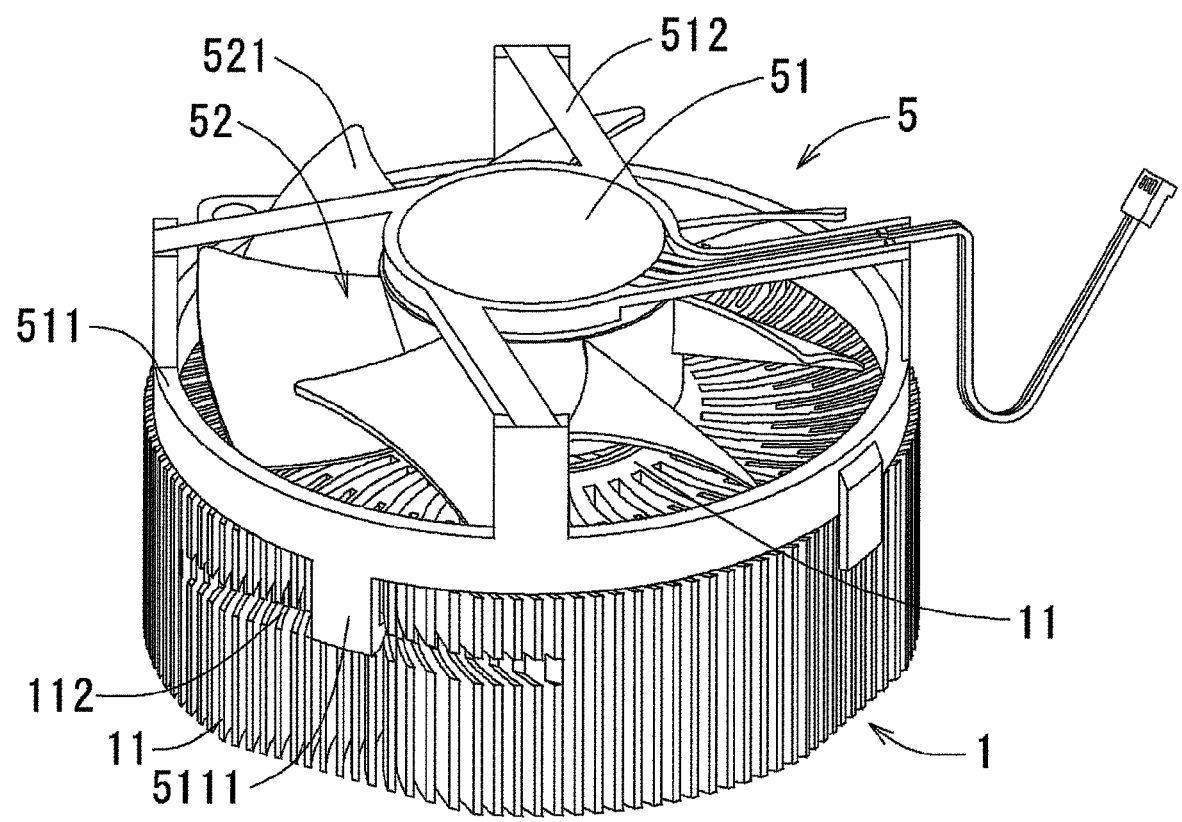
FIG. 4 is a perspective view of the heat sink according to the preferred embodiment of the present invention which is assembled with a cooling fan.

FIGS. 1 and 2 are a plan view and a perspective view of a heat sink according to a preferred embodiment of the present invention, respectively. FIG. 3 is a side view of the heat sink of FIG. 1 attached to an MPU which is an object to be cooled. FIG. 4 shows the heat sink of FIG. 1 and a cooling fan assembled therewith.

A heat sink 1 is a member which dissipates a heat and is made of material having relatively high thermal conductivity. In this preferred embodiment, the heat sink 1 is made of aluminum alloy by drawing or extrusion. Examples of the material of the heat sink 1 other than aluminum alloy are aluminum, copper, and copper alloy. The heat sink 1 may be formed by any other known techniques, e.g., cutting.

The heat sink 1 includes a base portion 11 and a plurality of heat-dissipating fins 12. In order to increase an area of direct contact between the heat sink 1 and air, i.e., a surface area of the heat sink 1, the fins 12 are integrally formed with the base portion 11. More specifically, the base portion 11 is generally columnar about a predetermined center axis and the fins 12 are arranged on an outer side surface of the base portion 11 continuously with the base portion 11. Please note that the outer shape of the base portion 11 is not limited to the column. The base portion 11 may have a different outer shape. For example, the base portion 11 may be in the form of a generally quadrangular prism.

As shown in FIG. 1, the fins 12 are arranged radially about the center axis of the base portion 11 on the outer side surface of the base portion 11 and extend outward from the base portion 11 in a radial direction perpendicular or substantially perpendicular to the center axis. The fins 12 are curved in the same direction in order to further increase the surface area of the heat sink 1. In this preferred embodiment, the fins 12 are curved in a counterclockwise direction as viewed from above the heat sink 1. Please note that each fin 12 has any other shape as long as that shape is designed to increase the total surface area of the heat sink 1.

Referring to FIG. 1, the base portion 11 is generally cylindrical centered on the center axis. The base portion 11 has a through hole formed therein and centered on the center axis. A core 13 having a generally columnar shape is fitted into the through hole of the base portion 11. That is, the core 13 is secured to an inner circumferential surface of the base portion 11. The core 13 is made of material having higher thermal conductivity than that of the base portion 11. In this preferred embodiment, the core 13 is made of copper while the base portion 11 is made of aluminum alloy. Please note that FIGS. 1 to 3 and 5 to 8 show the core 13 already fitted into the through hole of the base portion 11. Although the shape of the core 13 is not limited to a generally columnar shape, the generally columnar core 13 is preferably cylindrical. This is because a generally cylindrical core 13 can be formed with a high dimensional accuracy by being processed with a lathe or the like.

A diameter of an outer side surface of the core 13 and a diameter of the inner circumferential surface of the base portion 11 are important factors in order to reduce a contact thermal resistance at a contact portion between the core 13 and the base portion 11 (i.e., a heat transfer resistance of contact surfaces of the core 13 and the base portion 11). The contact thermal resistance is determined depending on a contact pressure, a contact area, surface roughness of contacting surfaces, thermal conductivity of each of the core 13 and the base portion 11, hardness of the surface of each of the core 13 and the base portion 11.

The core 13 is inserted and press-fitted into the center hole of the base portion 11 so as to increase a contact pressure between the side surface of the core 13 and the inner circumferential surface of the base portion 11, so that the contact thermal resistance at the contact surface between the core 13 and the base portion 11 is reduced. More specifically, the base portion 11 is heated up to a high temperature to cause a thermal expansion to the base portion 11, the core 13 is inserted into the center hole of the thermally expanded base portion 11, and then the base portion 11 is cooled down (i.e., a shrinkage fit is used). The base portion 11 and the core 13 thus fitted to each other allow a heat transferred from an MPU 3 to the core 13 to be effectively transferred to the base portion 11. The heat transferred to the base portion 11 is dissipated to ambient air through the fins 12. Instead of forming the center hole, a recess centered on the center axis may be formed in the base portion 11. In this case, the core 13 is also fitted into the recess, for example, by shrinkage fit.

In this preferred embodiment, the core 13 is secured to the inner circumferential surface of the base portion 11 by press-fitting. However, the present invention is not limited thereto. For example, as an alternative, the core 13 and the base portion 11 may be integrally formed of the same material from a point of view of reduction in processing steps and improvement of cooling efficiency. That is, the core 13 and the base portion 11 can be made of the same material as each other and can be formed as a single continuous member.

In general, extrusion and drawing of aluminum only require a mold having a simple structure and provide a finished dimensional accuracy higher than extrusion and drawing of material having a lower hardness than aluminum, e.g., copper. In addition, it is quite difficult to form a product of a desired shape by extrusion or drawing of copper. In the extrusion or drawing of copper, a finished dimensional accuracy is extremely low. Therefore, the complex heat sink 1 in which the fins 12 are integrally formed with the base portion 11 is made of aluminum instead of copper in this preferred embodiment.

The MPU 3 is mounted on a motherboard 31 of a computer, and is electrically connected to other electronic components of the computer. Referring to FIG. 3, the core 13 is in contact with the MPU 3 at its contact surface 131. A thermally conductive member (not shown) is arranged between the MPU 3 and the contact surface 131 of the core 13. Thus, heat generated in the MPU 3 is transferred to the core 13. That is, contact thermal resistance between the MPU 3 and the contact surface 131 of the core 13 is crucial in efficiently transferring the heat generated in the MPU 3 to the core 13. For example, if flatness of the contact surface 131 of the core 13 and that of a surface of the MPU 3 which comes into contact with the contact surface 131 are zero, surface roughness of the surface of the MPU 3 and the contact surface 131 are zero, and the contact pressure is high, the contact thermal resistance can be very small. However, neither the flatness nor the surface roughness of the surface of the MPU 3 or the contact surface 13 can actually be zero. Without the thermally conductive member between the MPU 3 and the contact surface 131, an air gap is formed between the MPU 3 and the contact surface 131. The air gap between the MPU 3 and the contact surface 131 will increase a high contact thermal resistance due to a high thermally insulating property of air. However, in this preferred embodiment, the thermally conductive member, which can be deformed in accordance with the shape of the surface in contact therewith, is arranged between the MPU 3 and the contact surface 131, as described above. Thus, an air layer cannot be formed and the contact thermal resistance can be lowered.

The thermally conductive member is made of material having high thermal conductivity. In this preferred embodiment, a tape-shaped thermally conductive member is used from the viewpoint of workability. An example of the tape-shaped thermally conductive member is a thermal tape in which a supporting substrate such as a polyimide film, a fiber glass mat, or an aluminum foil is coated with pressure sensitive adhesive containing filler. The thermally conductive member is deformed in accordance with the shape of the surface of the MPU 3 and the contact surface 131 when being arranged between the MPU 3 and the contact surface 131. As a result, the contact area involved in the heat conduction is increased.

The contact thermal resistance is reduced with an increase in the contact areas. Therefore, for the material of the thermally conductive member, there can be used grease-like thermally conductive silicone resin containing silicone oil as base oil and highly thermally conductive powder, such as alumina powder, for example. The grease-like thermally conductive member is lower in viscosity than the tape-shaped thermally conductive member such as the thermal tape, and therefore, can flexibly change the shape depending on the surface shape of the MPU 3 and the contact surface 131. In a case of using the thermal tape, it is cut into a piece having a predetermined size, and therefore, may hardly make effective use of the areas of the surfaces of the MPU 3 and the contact surface 131. On the other hand, the thermally conductive silicone resin, due to its grease-like form, can be in close contact with the surface of the MPU 3 and the contact surface 131 almost without a gap so as to make effective use of the areas of the surfaces of the MPU 3 and the contact surface 131. The material and shape of the thermally conductive member between the MPU 3 and the contact surface 131 are not limited to the above. Any material and shape can be used, as long as it is excellent in thermal conductivity.

The thermal resistance of an object varies depending on the shape and material thereof. For example, highly thermally conductive materials such as copper exhibit a low thermal resistance. As regards the shape, the thermal resistance decreases with increase in thickness. Thus, it is advantageous to use a highly thermally conductive material having a large thickness along a thermal path in order to efficiently transfer heat. In this preferred embodiment, the core 13 is made of copper, and is so formed as to have as thick a diameter as possible. As a result, heat generated in the MPU 3 is efficiently transferred to the core 13, and then to the base portion 11.

The heat transferred to the base portion 11 is then transferred to the fins 12. Since a cooling fan 5 is provided to send air to the fins 12 in this preferred embodiment, as shown in FIG. 4, the heat transferred to the fins 12 is forcibly dissipated by the air sent from the cooling fan 5 when the cooling fan 5 is driven. The structure of the cooling fan 5 is now described referring to FIG. 4.

FIG. 4 is a perspective view of the heat sink 1 with the cooling fan 5 arranged above the heat sink 1.

The cooling fan 5 includes an impeller 52 which can be rotated about a rotation axis in a rotation direction to generate an airflow, an electric motor (not shown) which rotates the impeller 52, an air channel 511 which applies a static pressure to the airflow, a fan base 51 to which the electric motor is secured, and at least three spokes 512 which connect the fan base 51 to the air channel 511.

The impeller 52 has a plurality of blades 521. The blades 521 are radially arranged about the rotation axis of the impeller 52 and extend radially outward. In this preferred embodiment, the blades 521 are curved in the rotation direction, as shown in FIG. 4. When the impeller 52 rotates in a predetermined rotation direction, the blades 521 provide air with kinetic energy. When the impeller 52 rotates, air is taken into the cooling fan 5 from above and is discharged downward. That is, an axial airflow flowing downward in FIG. 4 is generated. Since the airflow is generated by rotation of the impeller 52, the airflow contains three components: a centrifugal component flowing radially outward; a circling component flowing circumferentially around the central axis of the impeller 52; and an axial component flowing axially. Considering components of the velocity of the airflow, the airflow has a component spreading radially outward, and therefore, has the highest flow velocity at the radially outer portion of the impeller 52, the lowest at the radially inner portion of the impeller 52. Thus, the air sent to the heat sink 1 has the highest flow velocity in radially outer portions of the fins 12.

Referring to FIG. 4, the cooling fan 5 is arranged above the heat sink 1 with the rotation axis of the impeller 52 approximately coinciding with the center axis of the base portion 11. The outer side surface of the heat sink 1 is, as shown in FIG. 2, provided with a cutout 112, which is formed across the outer peripheral surfaces of the fins 12. An arm 5111 of the cooling fan 5, extending downward from the air channel 511, is engaged with the cutout 112, and thereby, the cooling fan 5 is secured to the heat sink 1.

Heat generated in the MPU 3 is transferred to the base portion 11 via the thermally conductive member and is then transferred to the fins 12. As described above, air is blown to the fins 12 by the rotating cooling fan 5. Both the fins 12 of the heat sink 1 and the blades 521 of the impeller 52 are arranged annularly about the same axis of the heat sink 1 and the cooling fan 5. As a result, the air efficiently flows into spaces between fins 12, and forcibly dissipates the heat transferred to the fins 12. That is, the combination of the heat sink 1 and the cooling fan 5 can provide better cooling performance.

In this preferred embodiment, the fins 12 are curved in a direction opposite to a direction of rotation of the impeller 52. More specifically, the fins 12 are curved in a counterclockwise direction. This configuration allows the airflow generated by the blades 521 and the fins 12 to be out of interfering phase. As a result, a noise resulting from interference of the airflow with the fins 12 can be reduced.

Figure 9:
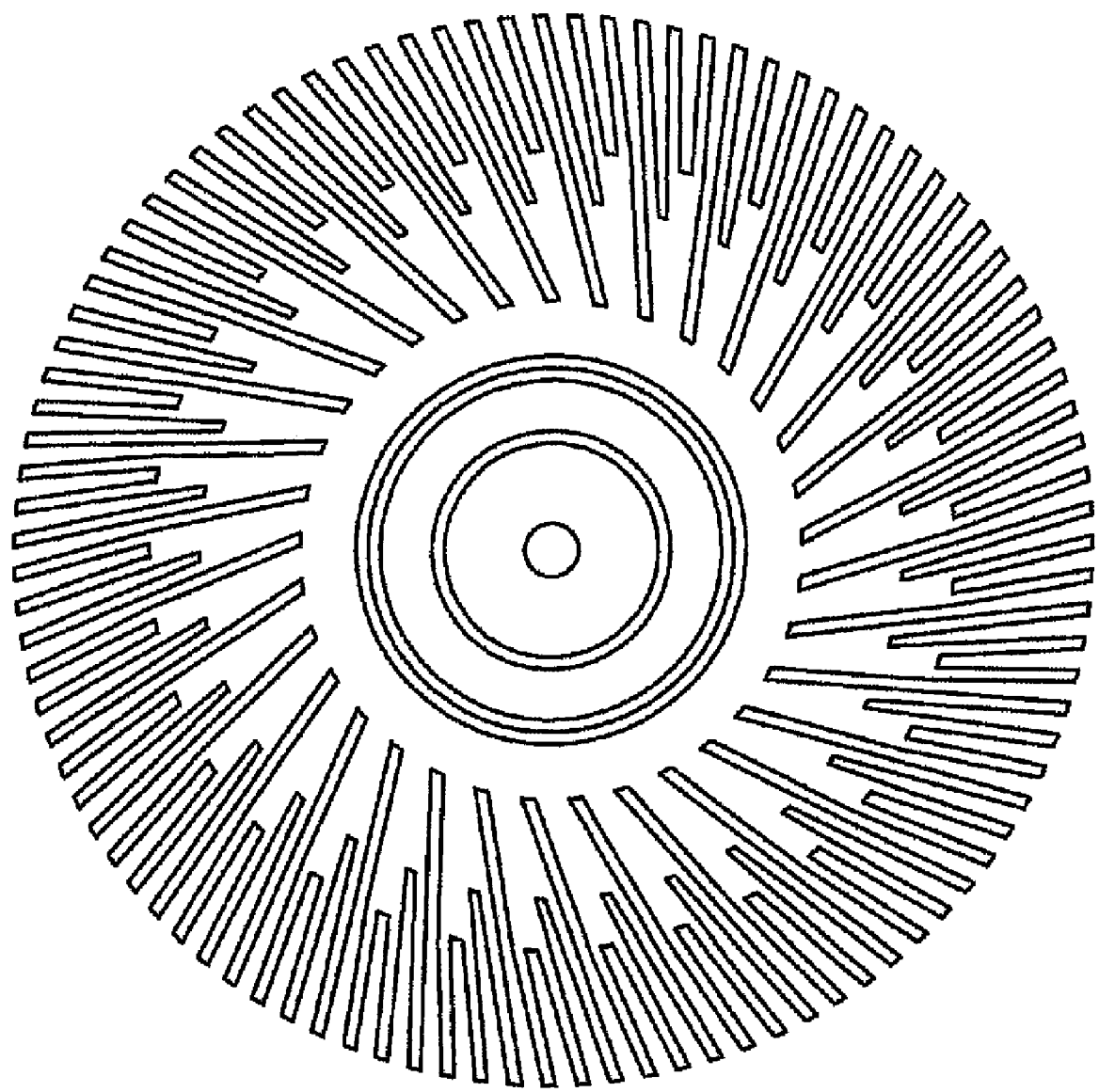
FIG. 9 is a plan view, in schematic form, of a heat sink according to another variation of the preferred embodiment of the present invention.

Alternatively, the fins 12 may be arranged at an angle to the radial direction, as shown in FIG. 9, instead of being curved. In this case, it is also possible to sufficiently reduce interference of the airflow with the fins 12. Moreover, the fins 12 may extend along the radial direction without being curved or inclined with respect to the radial direction. Since the blades 521 of the impeller 52 are curved in the rotation direction as described above, interference with the airflow and the fins 12 can be reduced by the fins 12 which merely extend radially outward.

The shape of the fins 12 is designed in consideration of the airflow blown by the cooling fan 5. Hereinafter, an exemplary specific shape of the fins 12 is now described in detail.

Returning to FIG. 1, each fin 12 is split into three or more ends with two or more slits arranged therebetween. In each fin 12, a stem portion 121 is connected to the base portion 11 and supports the split ends. The stem portion 121 extends from the base portion 11 outward in the radial direction. The fins 12 are curved in the same direction with respect to the radial direction in this preferred embodiment in order to increase the surface area of each fin 12. In the shown example, the fins 12 are curved in a counterclockwise direction as viewed from above. Such a curved shape of the fins 12 also contributes to reduction in interference with the airflow from the cooling fan 5 and the fins 12, as described above.

Each fin 12 is provided with a first slit 1220 extending radially outward along an extending direction of the fin 12. The first slit 1220 does not reach the base portion 11 but is formed only in a radially outer portion of the fin 12. Thus, the fin 12 is split into first fin end portions 1221 and 1222 by the first slit 1220. For the sake of convenience, one of the first fin end portions which is located in advance of the other in a curving direction of the fins 120, i.e., in the counterclockwise direction is referred to as a forward first fin end portion 1221 while the other is referred to as a backward first fin end portion 1222.

The backward first fin end portion 1222 has a second slit 1230 extending radially outward in the extending direction of the fin 12. Thus, the backward first fin end portion 1222 is further split into second fin end portions 1231 and 1232 by the second slit 1230. For the sake of convenience, one of the second fin end portions 1231 and 1232 which is located ahead of the other in the curving direction of the fins 12, i.e., in the counterclockwise direction is referred to as a forward second fin end portion 1231 while the other is referred to as a backward second fin end portion 1232. In this preferred embodiment, an inner end 1233 of the second slit 1230 is located outside an inner end 1223 of the first slit 1220 in the radial direction. The forward first fin end portion 1221 and the second fin end portions 1231 and 1232 are also curved in the curving direction of the fins 12, i.e., in the counterclockwise direction and extend approximately parallel to each other.

In order to increase the entire surface area of the heat sink 1, it is preferable that both the inner ends 1223 and 1233 of the first and second slits 1220 and 1230 be arranged as much close to the base portion 11 as possible. In other words, the first fin end portion 1222 and the second fin end portions 1231 and 1232 are preferably formed as long as possible to increase the entire surface area of the heat sink 1. On the other hand, if the inner end 1223 of the first slit 1220 and the inner end 1233 of the second slit 1230 are formed at the same radial position, inner ends of the first slit 1220, the second slit 1230, the forward first fin end portion 1221, and the second fin end portions 1231 and 1232 are arranged at the same radial position in a radially inner portion of the fin 12. This means that a circumferential width of the fin 12 becomes thicker at that radial position. In a typical heat sink having a plurality of heat dissipating fins generally radially arranged, a space for each heat dissipating fin is reduced radially inward. Therefore, when the radial position where the inner ends of the slits and the fin end portions are arranged is located in a radially inner portion of the fin 12, the number of fin end portions must be limited because of the space. Limiting the number of the fin end portions prevents increase in the surface area of the heat sink 1. For this reason, the inner end 1223 of the first slit 1220 and the inner end 1233 of the second slit 1230 are arranged at different radial positions from each other in this preferred embodiment, as shown in FIG. 1. Thus, the number of fin end portions gradually increases radially outward in each fin 12.

The thickest portion of each fin 12 (here, the thickness is that of the fin portions themselves excluding the slits) is the stem portion 121. The portion second largest in the circumferential thickness is the backward first fin end portion 1222. The forward first fin end portion 1221 and the second fin end portions 1231 and 1232 are the thinnest. However, the circumferential thickness of the backward first fin end portion 1222 is equal to or less than the total circumferential thickness of the two second fin end portions 1231 and 1232 and the second slit 1230 arranged therebetween. The circumferential thickness of the stem portion 121 is equal to or less than the total circumferential thickness of the forward first fin end portion 1221, the first slit 1220 and the backward first fin end portion 1222. The stem portion 121 and the backward first fin end portion 1222 become thinner radially inward.

As described above, the fin 12 is split into a plurality of fin end portions one by one from an inner side to an outer side in the radial direction. Thus, the circumferential spaces between the fins 12 can be utilized efficiently and the surface area of each fin 12 can be increased.

Next, behavior of air sent from the cooling fan 5 to the heat sink 1 is described. As described above, the cooling fan 5 generates a large airflow on the radially outer portion and a small air flow on the radially inner portion. Consequently, also as regards the air blown to the heat sink 1, the air flow is larger in the radially outer portion and smaller in the radially inner portion. In the radially inner portion of the fin 12, the flow of the cooling air is small, causing small effects of the forced cooling. This means that the stem portion 121 of each fin 12 mainly functions to transfer heat to the fin end portions. However, since the air is blown to the stem portion 121 although the air flow is small, the stem portion 121 is also forcibly cooled although only slightly. Further, since clearances are secured between adjacent stem portions 121, the air passes through the clearances between the stem portions 121 and is discharged. As a result, the air flow does not stay within the heat sink 1. The stem portion 121 is, as described above, the portion having the largest circumferential thickness of the fin 12. Therefore, the stem portion 121 is smaller in thermal resistance than the fin end portions, so as to transfer heat efficiently to fin end portions.

Radially outside the stem portion 121 in each fin 120, there are formed the forward first fin end portion 1221, the forward second fin end portion 1231 and the backward second fin end portion 1232. These fin end portions are formed in a region where the air flow is the largest, and therefore, are more effectively forcibly cooled as the surface area is larger. In this preferred embodiment, since the circumferential widths of the clearances between the adjacent fin end portions are not too small, the energy loss of the air flow is small and the air flow hardly stays in the clearances between the adjacent branch fin portions.

When a length in the extending direction of each fin end portion is compared among the forward first fin end portion 1221, the forward second fin end portion 1231, and the backward second fin end portion 1232, the forward first fin end portion 1221 is the largest. Since the fin end portions 1221, 1231 and 1232 are almost the same in thickness, the forward first fin end portion 1221 having the largest extension-wise length is the largest in heat dissipation. The impeller 52 rotates in a clockwise direction. Therefore, the forward first fin end portion 1221 is a portion that receives the airflow generated by the rotating impeller 52 first in the fin 12. Therefore, it is preferable that the fin end portion, that has a large extension-wise length among the fin end portions provided in the fin 12, be located ahead of all other fin end portions in the counterclockwise direction.

A thermal resistance value was measured for a cooling apparatus including the heat sink 1 of this preferred embodiment and the cooling fan 5 attached thereto. For comparison, a thermal resistance value was also measured for a comparative cooling apparatus including a comparative heat sink having fins each split into two ends in a radially outer portion thereof and the cooling fan 5 attached thereto.

First, how to measure the thermal resistance is described. A heater is brought into contact with the contact surface 131. Heat generated by the heater simulates heat generated by the MPU 3. It is assumed that a power applied to the heater is W, a surface temperature of the heater is TC (° C.), and a temperature of ambient air on a side of the cooling fan 5 from which air is taken into the cooling fan 5 is TA (° C.). Then, the thermal resistance θ can be calculated by the formula θ=(TC−TA)/W.

The thermal resistance value of the comparative cooling apparatus comprising the comparative heat sink, as obtained using the above-stated formula, was 0.190 (° C./W). The thermal resistance value of the cooling apparatus comprising the heat sink 1 of the preferred embodiment was 0.178 (° C./W). Therefore, use of the heat sink 1 of this preferred embodiment increased the thermal resistance by 6.7(%).

The increase by 6.7(%) in the thermal resistance value enables the amount of copper used for the core 13 to be reduced. That is, even if the amount of copper is reduced, the thermal resistance equivalent to that of the comparative heat sink having the fins each split into two ends can be achieved. Therefore, high unit-cost copper can be saved, and therefore, component costs can be reduced. Since copper is larger in specific gravity than aluminum alloy, the saving of copper also reduces total mass of the heat sink. Further, since the thermal resistance of the heat sink 1 itself has been improved, the cooling performance of the cooling fan 5 attached to the heat sink 1 can be lowered. This means that, even if the rotation speed of the impeller 52 of the cooling fan 5 is reduced, the thermal resistance equivalent to that of the comparative heat sink having the fins each split into two ends can be achieved. Reduction in the rotation speed of the impeller 52 can reduce a wind noise generated by the rotation of the impeller 52 and an interference noise caused by the interference of the airflow with the fins, resulting in a reduction in the noise level of the cooling apparatus. Accordingly, use of the heat sink 1 of this preferred embodiment brings many advantageous results, such as a reduction in component weight, a reduction in component costs, a reduction of a noise and others.

The shape of the fins 12 is not limited to the above shape. The fins 12 may have any other shape, as long as the inner ends 1223 and 1233 of the adjacent slits formed in each fin 12 are formed at different radial positions and each fin 12 is split into end portions such that the surface area of the fin 12 increases radially outward.

Figure 5:
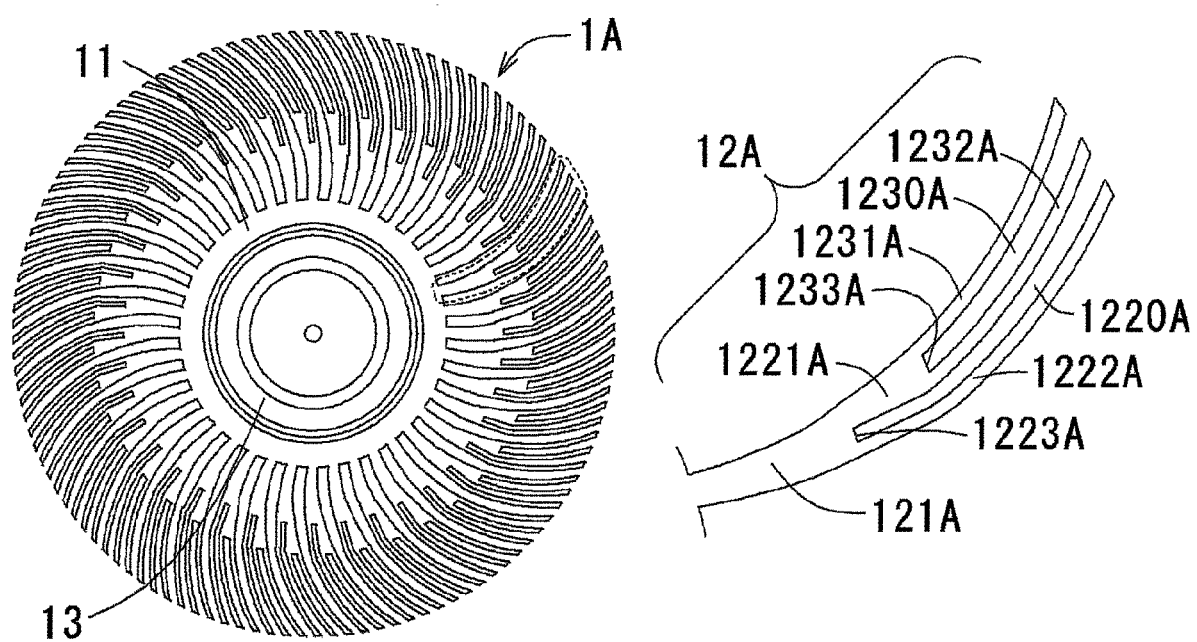
FIG. 5 is a plan view of a heat sink according to a variation of the preferred embodiment of the present invention.

FIG. 5 is a plan view of a heat sink 1A according to a variation of the preferred embodiment of the present invention, as viewed from above. The fins 12A are curved in the counterclockwise direction as in the example of FIG. 1. Referring to FIG. 5, each fin 12A is provided with a first slit 1220A extending radially outward in an extending direction of the radiation fin 12A. The first slit 1220A is formed only in a radially outer portion of the fin 12A. The fin 12A is split by the first slit 1220A into first fin end portions 1221A and 1222A.

Unlike the heat sink 1 of FIG. 1, one of the first fin end portions 1221A which is located ahead of the other 1222A in the counterclockwise direction is further split into second fin end portions 1231A and 1232A by a second slit 1230A extending radially outward in the extending direction of the fin 12A. The second slit 1230A is formed only in a radially outer portion of the fin 12A and starts from a position outside an inner end of the first slit 1220A in the radial direction. Except for the above, the heat sink 1A is the same as the heat sink 1 of FIG. 1.

Figure 6:
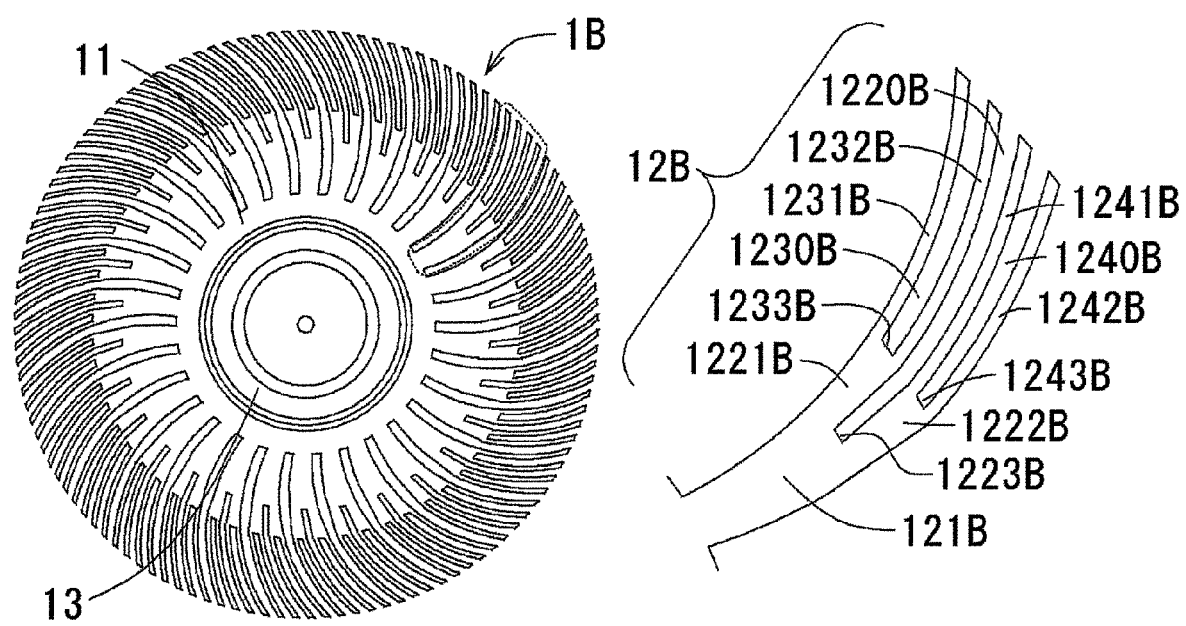
FIG. 6 is a plan view of a heat sink according to another variation of the preferred embodiment of the present invention.

FIG. 6 is a plan view of a heat sink 1B according to another variation of the preferred embodiment of the present invention. Referring to FIG. 6, fins 12B are curved in the counterclockwise direction like the fins 12 of the heat sink 1 of FIG. 1. Each fin 12B is provided with a first slit 1220B extending radially outward in the extending direction of the radiation fin 12B. The first slit 1220B does not reach the base portion 11 but is formed only in a radially outer portion of each fin 12B. Thus, the fin 12B is split into first fin end portions 1221B and 1222B. One of the first fin end portions 1221B is located ahead of the other first fin end portion 1222B in the counterclockwise direction, i.e., in the curving direction of the fin 12B.

The forward first fin end portion 1221B is further split into two second fin end portions 1231B and 1232B by a second slit 1230B extending radially outward in the extending direction of the fin 12B. The second slit 1230B is formed only in a radially outer portion of the fin 12B. One of the second fin end portions 1231B is ahead of the other 1232B in the counterclockwise direction.

The backward first fin end portion 1222B is provided with a third slit 1240B extending radially outward in the extending direction of the fin 12B. Thus, the backward first fin end portion 1222B is split into third fin end portions 1241B and 1242B. The third slit 1240B is formed only in a radially outer portion of the fin 12B. In addition, inner ends 1233B and 1243B of the second and third slits 1230B and 1240B are located outside an inner end 1223B of the first slit 1220B in the radial direction. The inner ends 1233B and 1243B of the second and third slits 1230B and 1240B are located at approximately the same radial position in the example of FIG. 6. Except for the above, the heat sink 1B is the same as the heat sink 1 of FIG. 1. Therefore, the detailed description of other portions in the heat sink 1B is omitted here.

Although the inner ends 1233B and 1243B of the second and third slits 1230B and 1240B are arranged at approximately the same radial position in the example of FIG. 6, they may be arranged at different radial positions from each other. In this case, it is also possible to obtain the same or more advantageous effects.

Figure 7:
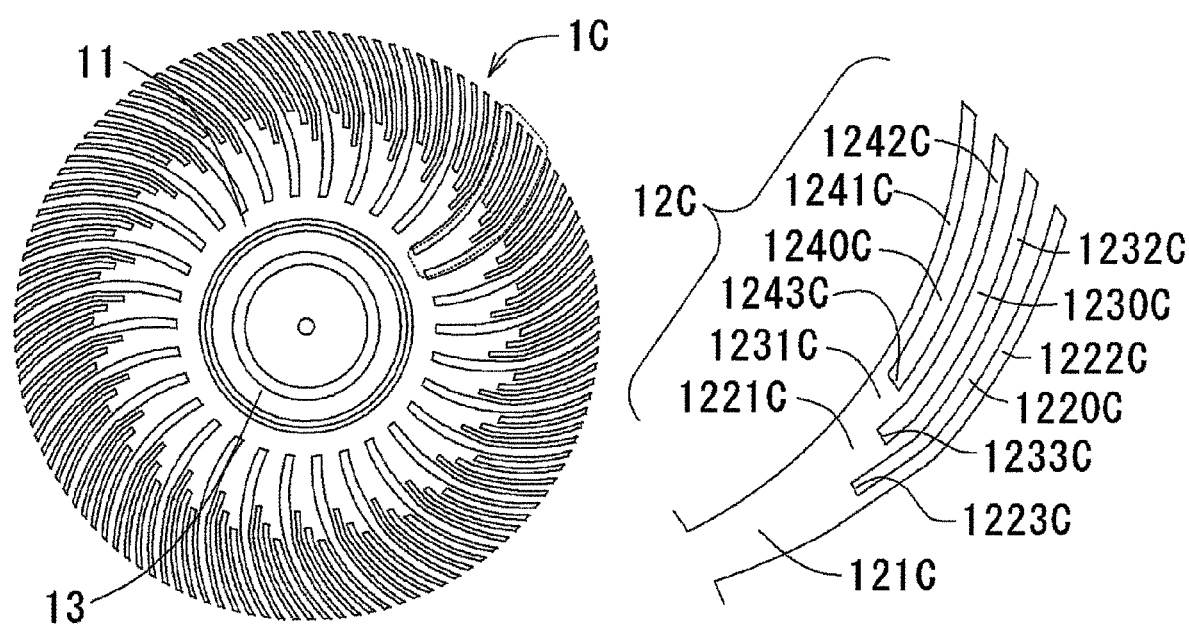
FIG. 7 is a plan view of a heat sink according to still another variation of the preferred embodiment of the present invention.

FIG. 7 is a plan view of a heat sink 1C according to still another variation of the preferred embodiment of the present invention. Referring to FIG. 7, fins 12C are curved in the counterclockwise direction like the fins 12 of the heat sink 1 of FIG. 1. Each fin 12C is provided with, in its radially outer portion, a first slit 1220C extending radially outward in the extending direction of the fin 12C. Thus, the fin 12C is split into first fin end portions 1221C and 1222C by the first slit 1220C.

A forward one of the first fin end portions 1221C, which is ahead of the other in the counterclockwise direction, is further split into second fin end portions 1231C and 1232C by a second slit 1230C extending radially outward along the extending direction of the fin 12C. As shown in FIG. 7, an inner end 1233C of the second slit 1230C is outside an inner end 1223C of the first slit 1220C in the radial direction.

A forward one of the second fin end portions 1231C, which is ahead of the other in the counterclockwise direction, is further split into third fin end portions 1241C and 1242C by a third slit extending radially outward along the extending direction of the fin 12C. As shown in FIG. 7, an inner end 1243C of the third slit 1240C is outside the inner end 1233C of the second slit 1230C in the radial direction. That is, the inner ends 1223C, 1233C, and 1243C of the first, second, and third slits 1220C, 1230C, and 1240C are arranged from an inner side to an outer side in the radial direction in that order. Except for the above, the heat sink 1C is the same as the heat sink 1 of FIG. 1. Therefore, the detailed description of the portion having the same structure is omitted here.

Figure 8:
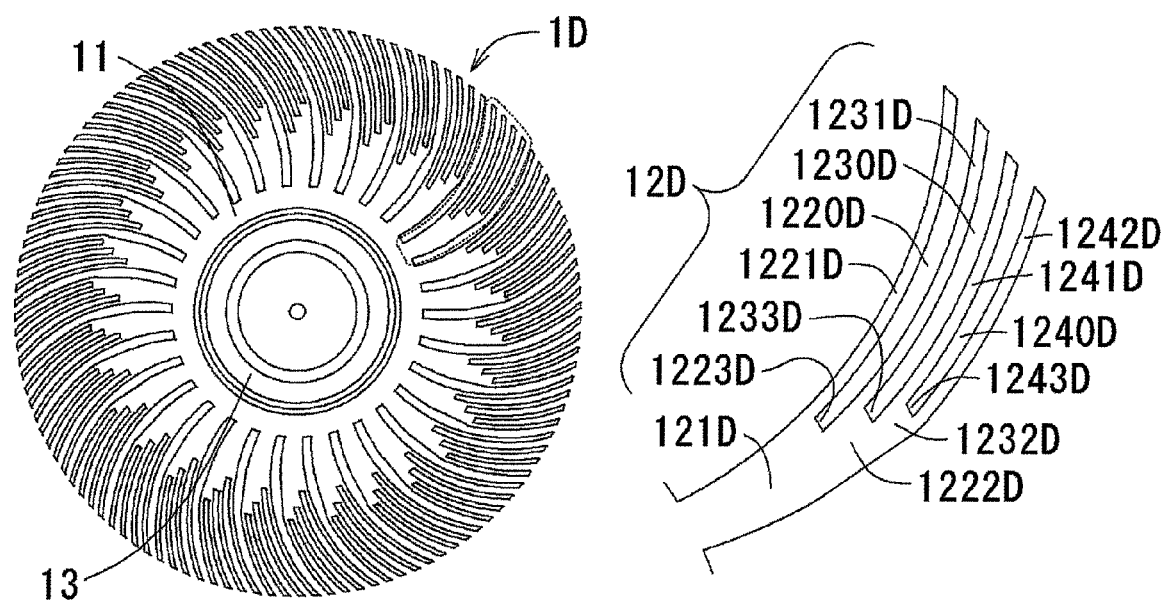
FIG. 8 is a plan view of a heat sink according to still another variation of the preferred embodiment of the present invention.

FIG. 8 is a plan view of a heat sink 1D according to still another variation of the preferred embodiment of the present invention. Referring to FIG. 8, fins 12D are curved in the counterclockwise direction. Each fin 12D is provided with, in its radially outer portion, a first slit 1220D extending radially outward in the extending direction of the fin 12D. Thus, the fin 12D is split into first fin end portions 1221D and 1222D by the first slit 1220D.

One of the first fin end portions 1222D, which is behind of the other first fin end portion 1221D in the counterclockwise direction, is further split into second fin end portions 1231D and 1232D by a second slit 1230D extending radially outward in the extending direction of the fin 12D. The second slit 1230D is formed only in the fin 12D. An inner end 1233D of the second slit 1230D is arranged outside an inner end 1223D of the first slit 1220D in the radial direction.

One of the second fin end portions 1232D, which is behind of the other second fin end portion 1231D in the counterclockwise direction, is further split into third fin end portions 1241D and 1242D by a third slit 1240D extending radially outward in the extending direction of the fin 12D. The third slit 1240D is formed only in the radially outer portion of the fin 12D. An inner end 1243D of the third slit 1240D is arranged radially outside the inner end 1233D of the second slit 1230D. That is, the inner ends 1223D, 1233D, and 1243D of the first, second, and third slits 1220D, 1230D, and 1240D are arranged from an inner side to an outer side in the radial direction in that order. Except for the above, the heat sink 1D is the same as the heat sink of FIG. 1. Therefore, the detailed description of the portion having the same structure in the heat sink 1D is omitted here.

The shape of the fins of the heat sink is not limited to those described above, but rather, various other preferred embodiments can be devised. The shape of the fins 12 can be appropriately modified.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A heat sink for dissipating heat from an object, the heat sink having a center axis whereby a circumferential direction of the heat sink extends around the center axis and a radial direction of the heat sink extends normally to the center axis, the heat sink comprising:
    a plurality of fins spaced from one another about the center axis in the circumferential direction of the heat sink,
    each of the fins extending lengthwise in an outward direction away from the center axis whereby the fins radiate with respect to the center axis, wherein
    each of the fins has a stem at a radially inner end thereof and is split radially outwardly of the stem at each of at least two locations,
    at least two of said locations, at which each fin is split, are offset from one another along the length of each fin such that each fin has at a radially outer end thereof at least three outer fin end portions spaced from one another in the circumferential direction and such that each fin defines slits between adjacent ones of the outer fin end portions, and
    a radially innermost end of one of the slits is offset radially inwardly along the length of each fin from a radially innermost end of another of the slits.

2. A heat sink according to claim 1, wherein each of the fins lies in a plane extending at an angle to a plane extending radially from the center axis through the radially inner end of each fin, and the fins are angled the same relative to the radial direction of the heat sink.

3. A heat sink according to claim 1, wherein the plurality of fins are curved in the same direction.

4. A heat sink according to claim 3, wherein the at least three outer fin end portions are curved in the same direction.

5. A heat sink according to claim 4, wherein the at least three outer fin end portions extend substantially parallel to each other.

6. A heat sink according to claim 1, wherein the slits defined by each fin include a first slit that is closer to an adjacent one of the fins than at least one other slit defined by each fin, and the first slit has a radially innermost end that is offset radially inwardly along the length of each fin from a radially innermost end of at least one other slit defined by each fin.

7. A heat sink according to claim 6, wherein the fins are curved along the length thereof radially outwardly in one of a counterclockwise direction and a clockwise direction with respect to the center axis of the heat sink, and
    the first slit is located ahead of at least one of the other of the slits defined by each fin in said one of the counterclockwise direction and the clockwise direction.

8. A heat sink according to claim 1, wherein each of the fins is split in two at a first of said locations so as to have two first fin end portions extending radially outwardly from the first of said locations, and each of the two first fin end portions is split into at least two second fin end portions.

9. A heat sink according to claim 1, wherein each of the fins is split in two at a first of said locations so as to have two first fin end portions extending radially outwardly from the first of said locations, and one of the two first fin end portions is split into at least two second fin end portions, and the other of the two first end portions extends to the radially outermost end of each fin without being split.

10. A heat sink according to claim 9, wherein the fins including the first and second fin end portions thereof are curved so as to have one side that is convex and another side that is concave, and one of the two first fin end portions which is closer to the convex side than the other of the first fin end portions is split into at least two second fin end portions.

11. A heat sink according to claim 9, wherein the fins including the first and second fin end portions thereof are curved so as to have one side that is convex and another side that is concave, and one of the two first fin end portions which is closer to the concave side than the other of the first fin end portions is split into at least two second fin end portions.

12. A heat sink according to claim 1, further comprising a generally columnar base portion centered on the center axis, wherein
    the fins extend from the base portion outward in the radial direction.

13. A heat sink according to claim 12, wherein the base portion has a center hole centered on the center axis, and
    a heat conductive core portion fitted within the center hole to the base portion.

14. A cooling apparatus comprising:
    the heat sink according to claim 1; and
    a cooling fan arranged coaxially with the center axis of the heat sink and supplying air to the heat sink, wherein the cooling fan includes:
    an impeller having a plurality of blades and being rotatable about the center axis to generate an axial air flow;
    a motor rotating the impeller about the center axis; and
    a housing surrounding the impeller to define an air channel for the axial air flow and supporting the motor.

15. A heat sink according to claim 1, further comprising a generally columnar base portion centered on the center axis, wherein
    the fins extend from the base portion outward in the radial direction.

16. A heat sink according to claim 15, wherein the base portion has a center hole centered on the center axis, and
    a heat conductive core portion fitted within the center hole to the base portion.

17. A cooling apparatus comprising:
the heat sink according to claim 1; and
a cooling fan arranged coaxially with the center axis of the heat sink and supplying air to the heat sink, wherein the cooling fan includes:
an impeller having a plurality of blades and being rotatable about the center axis to generate an axial air flow;
a motor rotating the impeller about the center axis; and
a housing surrounding the impeller to define an air channel for the axial air flow and supporting the motor.

* * * * *